(12) United States Patent
Ashida

(10) Patent No.: US 6,365,420 B2
(45) Date of Patent: Apr. 2, 2002

(54) METHOD OF FORMING DIELECTRIC FILM WITH GOOD CRYSTALLINITY AND LOW LEAK

(75) Inventor: Hiroshi Ashida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/809,191

(22) Filed: Mar. 16, 2001

(30) Foreign Application Priority Data

Feb. 16, 2000 (JP) .......................................... 2000-142867

(51) Int. Cl.[7] ................................................ H01G 7/06
(52) U.S. Cl. ............................................ 438/3; 438/240
(58) Field of Search .......................... 438/3, 240, 238, 438/250–256, 381, 393–399

(56) References Cited

U.S. PATENT DOCUMENTS 4,759,823 A * 7/1988 Asselanis et al. ............ 430/313
5,337,207 A * 8/1994 Jones et al. .................. 361/321
6,114,199 A * 9/2000 Isobe et al. ...................... 438/3

FOREIGN PATENT DOCUMENTS

JP         08-083894         3/1996

* cited by examiner

Primary Examiner—Jey Tsai
(74) Attorney, Agent, or Firm—Armstrong, Westerman & Hattori, LLP

(57) ABSTRACT

A dielectric film forming method includes forming on a surface of underlie substance a film of an oxide dielectric material including lead or bismuth, treating a surface of the oxide dielectric film with solution of nitric acid, and crystallizing the oxide dielectric film by annealing the film to obtain an oxide dielectric film. This provides a method of forming a dielectric film with good dielectric characteristics.

20 Claims, 7 Drawing Sheets

FIG. 2A
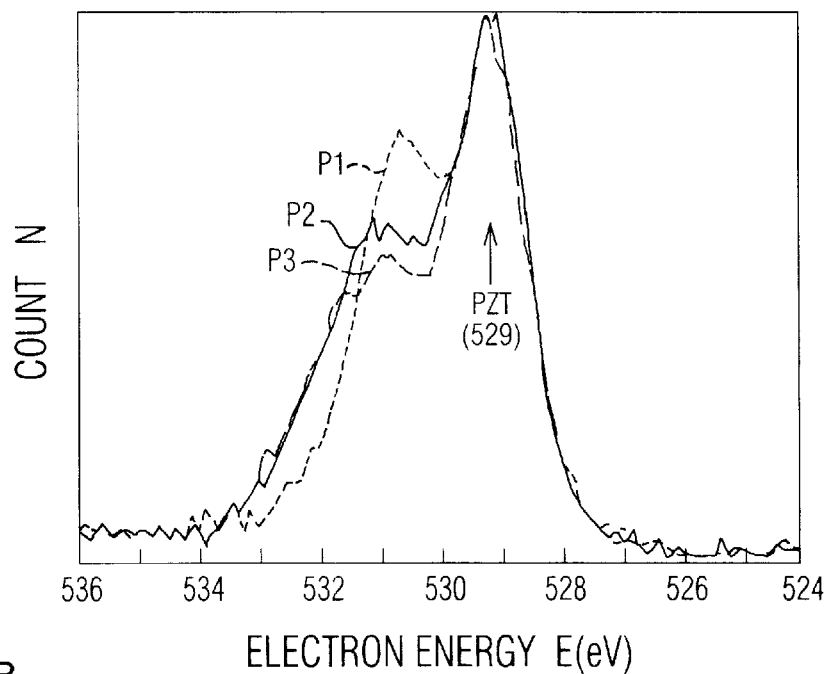
FIG. 2B
| | $Q_{sw}$ $\mu C/cm^2$ | $I_L$ $A/cm^2$ |
|---|---|---|
| g1 | 42.7 | $7.0 \times 10^{-6}$ / $-1.7 \times 10^{-5}$ |
| g2 | 39.9 | $1.5 \times 10^{-6}$ / $-3.3 \times 10^{-6}$ |
| g3 | 40.4 | $3.0 \times 10^{-6}$ / $-2.8 \times 10^{-6}$ |
FIG. 2C
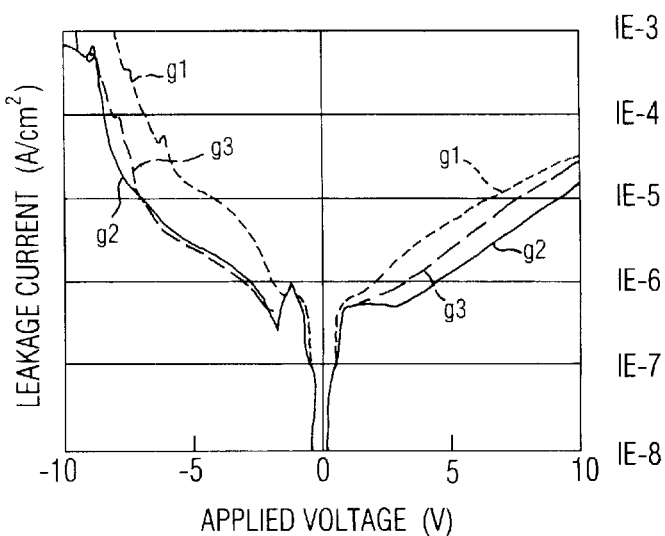

METHOD OF FORMING DIELECTRIC FILM WITH GOOD CRYSTALLINITY AND LOW LEAK

CROSS-REFERENCE TO RELATED APPLICATIONS

This application is based upon and claims priority of Japanese Patent Application No. 2000-142867, filed on May 16, 2000, the contents being incorporated herein by reference.

BACKGROUND OF THE INVENTION

1. Field of the Invention

The present invention relates to a method of forming a dielectric film, and in particular, to a method of forming a dielectric film for use in a capacitor and a semiconductor device.

2. Description of the Related Art

In fields of semiconductor devices, attention has been attracted to a ferrodielectric or ferroelectric film and high dielectric substances having a high dielectric constant or permittivity. This is because that, for example, use of high dielectric films in a dynamic random access memory (DRAM) results in miniaturization or minimization of capacitors for storing a required value of electric charge and hence advantageously increases the degree of integration. A non-volatile memory can be implemented using ferrodielectric films for capacitors of the DRAM. For such ferrodielectric films and the high dielectric substances, research and development have been conducted on materials such as lead zirconate titanate (PZT) and lead titanate (PTO). These substances have a common chemical formula of $ABO_3$.

Although lead zirconate titanate (PZT) doped with lanthanum (La), niobium (Nb), calcium (Ca), or strontium (Sr) is also known as a ferrodielectric substance, these substances will be collectively called lead zirconate titanate (PZT).

A dielectric film formed using oxide including lead is generally formed on a substrate by, for example, sputtering, sol-gel process, or chemical vapor deposition (CVD) at a room temperature. The dielectric layer formed at a room temperature is amorphous in an ordinary situation and will include a mixture of oxide of the constituent element. The film is then annealed at a temperature from 500° C. to 800° C. As a result, the film is crystallized to a target dielectric film.

To increase the integration degree of the semiconductor device, it is desired to reduce an area of the capacitor and film thickness of each constituent material. When the thickness of the dielectric film is reduced, intensity of an electric field generated by applying a constant voltage becomes greater, and hence a necessary voltage for operation of the device can be lowered. This also minimizes a surface step or step on a surface. The small surface step enhances fine work to be done above the step.

When the thickness of the dielectric film becomes equal to or less than 200 nanometers (nm), electric characteristics may be reduced in some cases. For example, there occur reduction of residual polarization charge and increase of leakage current. To produce a high-performance semiconductor device, it is desired to keep residual polarization charge at a high value and the leakage current at a low value.

In the process of crystallizing the dielectric material of oxide including lead, the element of lead is considered to contribute to formation of an initial kernel or nuclear in the crystallization. To achieve good crystallization, lead is favorably increased to an excessive extent. Excess lead causes increase of the leakage current after the crystallization. Therefore, a minimum quantity of excess lead for the crystallization is desired.

SUMMARY OF THE INVENTION

It is therefore an object of the present invention to provide a method of forming a dielectric film with high dielectric characteristics.

Another object of the present invention is to provide a method of forming a capacitor with high characteristics using a capacitor dielectric film including lead.

Still another object of the present invention is to provide a method of forming a semiconductor device with high characteristics using a capacitor dielectric film including lead.

According to one aspect of the present invention, there is provided a method of forming a dielectric film including the steps of forming on a surface of underlie substance a film of an oxide dielectric material including lead or bismuth, treating a surface of the oxide dielectric film with solution including nitric acid, and crystallizing the oxide dielectric film, after the surface treatment, by annealing the film and thereby obtaining an oxide dielectric film.

According to another aspect of the present invention, there is provided a method of forming a capacitor including the steps of forming on a surface of a first conductive layer a film of an oxide dielectric material including lead or bismuth, treating a surface of the oxide dielectric film with solution including nitric acid, crystallizing the oxide dielectric film, after the surface treatment, by annealing the film and thereby obtaining an oxide dielectric film, and forming a second conductive layer on said oxide dielectric film.

According to still another aspect of the present invention, there is provided a method of forming a semiconductor device including the steps of forming on a semiconductor substrate a transistor including one pair of current electrodes and a control electrode, covering the transistor with an inter-layer insulation film, forming a lower electrode on said inter-layer insulation film, forming on a surface of said lower electrode a film of an oxide dielectric material including lead or bismuth, treating a surface of the oxide dielectric film with solution including nitric acid, crystallizing the oxide dielectric film, after the surface treatment, by annealing the film and thereby obtaining an oxide dielectric film, and forming an upper electrode on said oxide dielectric film.

The obtained dielectric film has good crytallinity and a reduced surface layer.

Using the dielectric film, a capacitor with high electric characteristics can be fabricated.

Using the dielectric film, a semiconductor including capacitors with high electric characteristics can be produced.
dr

BRIEF DESCRIPTION OF THE DRAWINGS

The objects and features of the present invention will become more apparent from the consideration of the following detailed description taken in conjunction with the accompanying drawings in which:

FIGS. 2A to 2C are a graph and tables showing characteristics of samples in the embodiment according to the present invention;

DESCRIPTION OF THE PREFERRED EMBODIMENTS

For a method in which an oxide dielectric film including lead is formed in an amorphous state on a surface of underlie substance to thereafter anneal the film, the present inventor considered as follows.

The amorphous oxide dielectric film can be regarded as a mixture including oxide of the constituent element. Therefore, lead excessively contained in the film for crystallization is included in each grain and is also precipitated more easily on a surface of the grain or grain boundary. Although the excess lead will form the kernel of crystallization, it cannot be considered that all lead on the surface is required for the crystallization. The inventor considered to introduce treatment of the surface of the amorphous oxide dielectric film by acid.

Good results were not obtained through the surface treatment using fluoric acid, hydrochloric acid, and sulfuric acid. However, in surface treatment using nitric acid, there were obtained results better than those expected before. Description will next be given of an embodiment of the present invention.

Figure 1A:
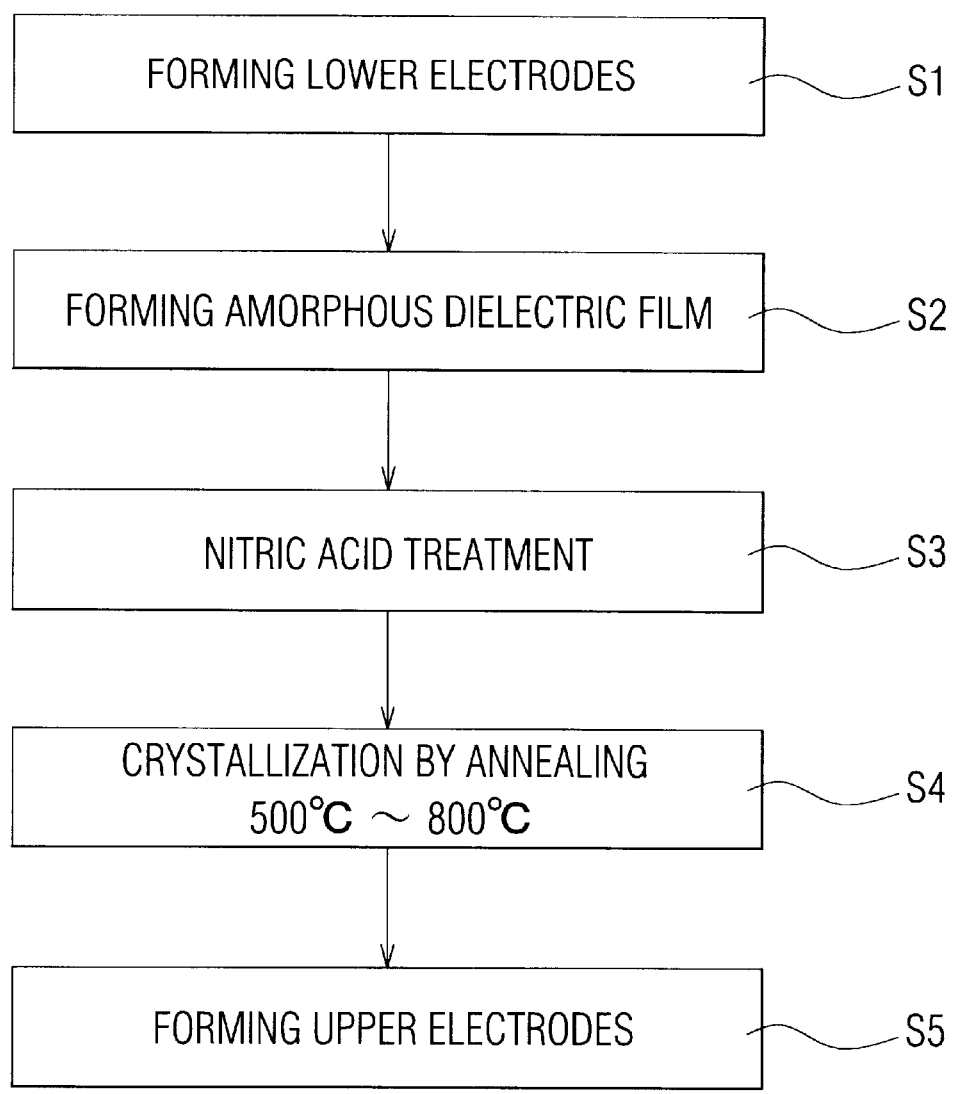
FIGS. 1A to 1E are a flowchart and schematic cross-sectional views to explain processes of manufacturing an embodiment of a dielectric film and a capacitor according to the present invention.

FIG. 1A shows, in a flowchart, basic processing steps of forming a dielectric film including oxide of lead in an embodiment of the present invention.

In step S1, a lower electrode is formed.

Figure 1B:
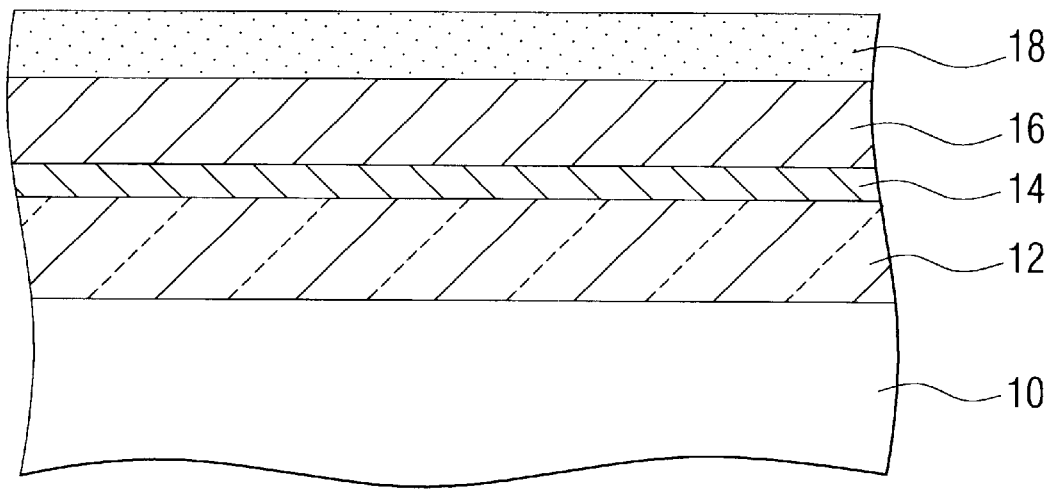

As shown in FIG. 1B, a silicon oxide film 12 with a thickness of about 200 nm is formed on, for example, a silicon substrate 10. Formed on the silicon oxide film 12 is an about 50 nm thick titanium (Ti) layer 14 serving as an adhesion layer on which an about 150 nm platinum (Pt) layer 16 serving as a main electrode is formed. The titanium layer 14 and the platinum layer 16 constitute a lower electrode. In the configuration, an alloy may be produced between the layers 14 and 16.

The silicon oxide film 12 may be a thermally oxidized film or a silicon oxide formed by, for example, CVD. The titanium layer 14 enhances adhesion between the platinum layer 16 and the silicon oxide film 12.

When the dielectric film is formed for other than a semiconductor device, a substrate other than the silicon substrate 10 may be used. The silicon oxide film 12 may be substituted for another insulation film. In place of the platinum film 16, another conductive film resistive against treatment at a high temperature may be used. For example, in place of platinum, a metal of platinum group or a conductive substance of oxide of a platinum group element may be used. As the platinum group metal, ruthenium (Ru), rhodium (Rh), iridium (Ir), or platinum (Pt) may be used. As the oxide of platinum group metal, $RuO_2$, $SrRuO_3$, or $IrO_2$ has been known.

In step S2, an amorphous dielectric film is formed on the lower electrode.

As shown in FIG. 1B, a layer 18 of, for example, lead zirconate titanate (PZT) is formed on the platinum layer 16 by sol-gel process, sputtering, or CVD. In the sol-gel process, a sol-gel solution in which organic compounds of PZT constituent elements are solved in solvent is applied on the lower electrode and is baked to form a dielectric film. When sputtering is used, the sputtering is conducted using a target of a material to accumulate a film of the material on the lower electrode. In the CVD process, a material gas is excited by heat or plasma to cause a desired reaction to pile a material film on the lower electrode.

The material film formed by the sol-gel process is amorphous in an initial state. The film formed by the sputtering or CVD on the substrate at a room temperature is also amorphous in an initial state. Although partially crystallized film may be formed by sputtering or CVD on a substrate heated, it is difficult to form a completely crystallized film. It is therefore determined to first form an amorphous dielectric film or a partially amorphous dielectric film.

In step S3, the film is treated with aqueous solution of nitric acid, which oxidizes lead.

Figure 1C:
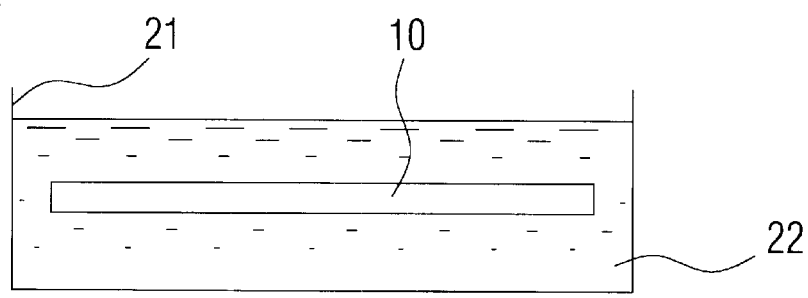
Figure 1C:

In the treatment, the substrate 10 is dipped into aqueous solution of nitric acid 22 in a container 21 as shown in FIG. 1CA.

The nitric acid treatment can also be carried out by forming a film of aqueous solution of nitric acid 22 on a dielectric film on a surface of the substrate 10 as shown in FIG. 1CB.

The nitric acid treatment may be achieved in a period of about ten seconds using aqueous solution of nitric acid of a concentration of, for example, about 2% by weight (wt %) to about 30 wt %.

After the nitric acid treatment, the substrate is annealed for crystallization at a temperature from 500° C. to 800° C. in step S4.

Figure 1D:
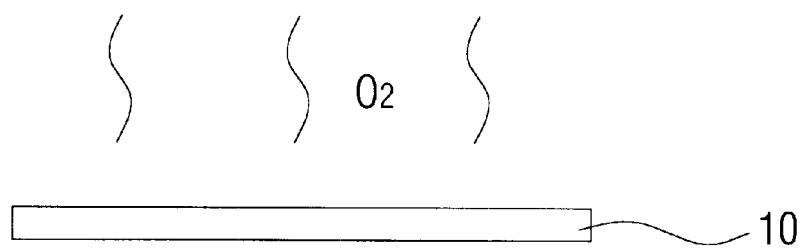

For example, the substrate is heated for about one minute in an atmosphere of oxygen at about 750° C. by rapid thermal annealing (RTA) as shown in FIG. 1D. As a result of the annealing, the dielectric film of a mixture of oxide of constituent element is changed into an objective dielectric film.

In the crystallization process, excess lead can be considered to serve as a kernel of growth. When the quantity of excess lead is too small, the lead to serve as the growth kernel is insufficient and the number of crystal kernels is minimized. This possibly grows grains having various diameters. With a sufficient quantity of excess lead, the obtained grains have almost a uniform diameter. Excess lead appearing on the surface can be reduced by the nitric acid treatment.

In step S5, an upper electrode is formed on the crystallized dielectric film.

Figure 1E:
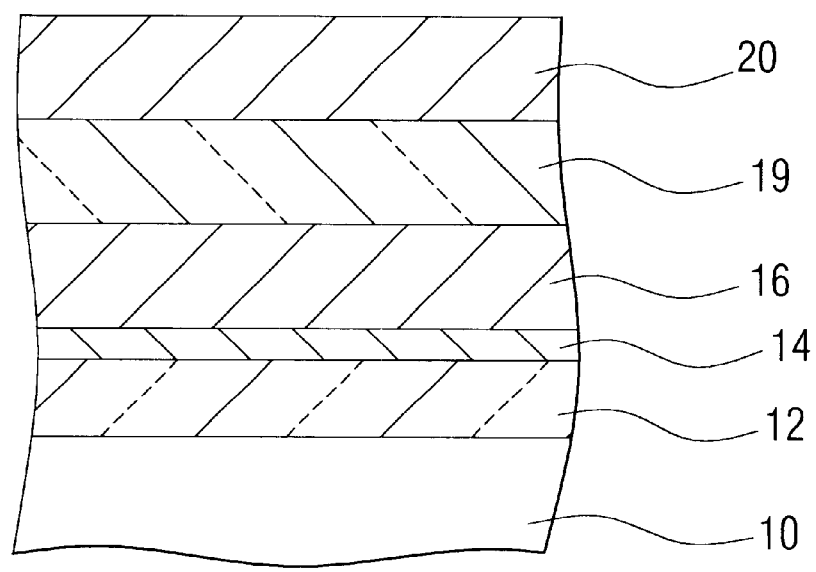

As shown in FIG. 1E, on the dielectric film 19 formed by crystallizing the dielectric film 18, there is formed, for example, a platinum layer 20 with a thickness of about 100 nm by sputtering.

Thickness of each material layer of the configuration may be appropriately altered depending on purposes. Each layer may be patterned by ion milling using argon (Ar) gas.

Description will now be given of results of experiments conducted for performance of the dielectric films and the capacitors formed in the embodiment.

Using a target of $Pb_{1.15}La_{0.03}$, $Ti_{0.60}O_3$ as the dielectric material, the material is accumulated on the lower electrode by sputtering at a room temperature.

The lower electrode is prepared as follows. On the silicon substrate, an about 50 nm thick titanium layer is formed. On the titanium layer, an about 150 nm thick platinum layer is formed. A dielectric film with a thickness of about 200 nm is accumulated at a room temperature. FIG. 1B shows the sample at this stage.

The nitric acid treatment is carried out using aqueous solution of nitric acid of 5 wt % and aqueous solution of nitric acid of 30 wt % for a treating period of ten seconds at a room temperature (24° C.).

Figure 4A:
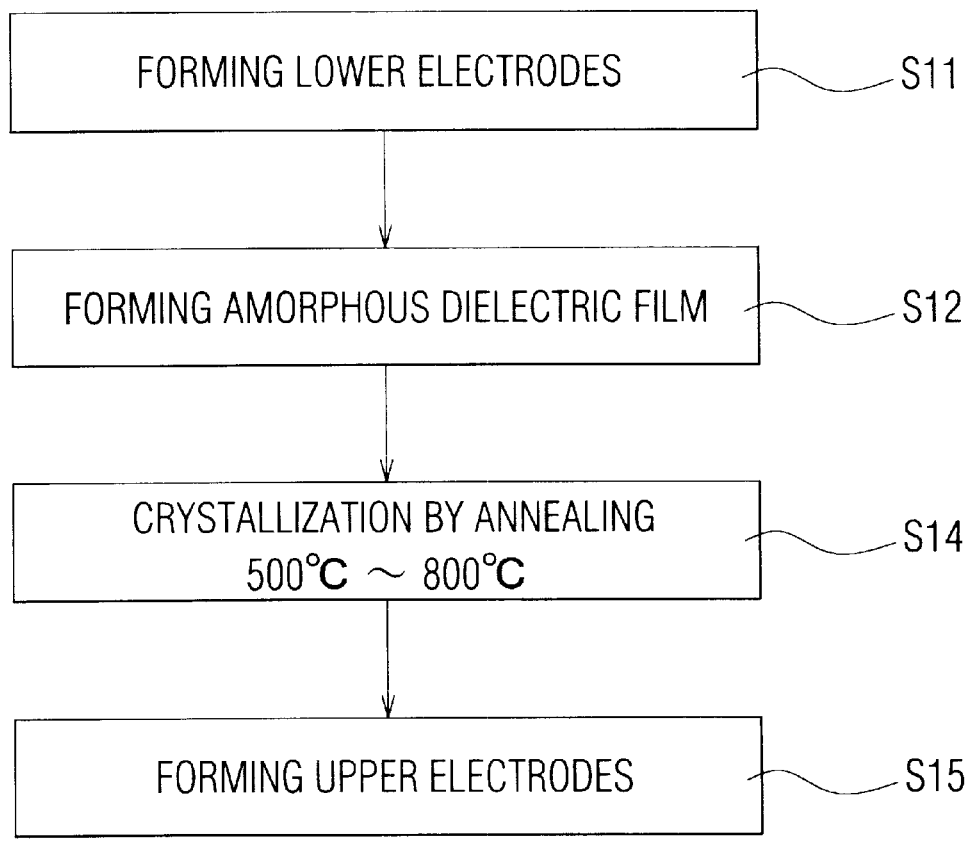
FIGS. 4A and 4B are a flowchart of processes to fabricate a dielectric film and a capacitor and a sketch of an electro-microscopic picture of a sample in a prior art.

For comparison, other samples are fabricated without conducting the nitric acid treatment. Comparative examples are fabricated through processes shown in FIG. 4A. Steps S11, S12, and S14 of FIG. 4A are the same as the steps S1, S2, and S4 of FIG. 1A, respectively. The nitric acid treatment in step S3 is not conducted in the processes of FIG. 4A.

The annealing for crystallization is carried out at 750° C. by RTA heating for one minutes in an oxygen atmosphere.

FIG. 2A shows results of measurement of surfaces of the obtained dielectric films by an X-ray photoelectron spectroscopy. In the graph, the abscissa represents electron energy E in electron volt (eV) and the ordinate represents a counted number N.

A sample P1 fabricated without conducting the nitric acid treatment has a peak at energy E (529 eV) for lead zirconate titanate (PZT). At the same time, the sample P1 also has a peak at a point near energy E=531 indicating a fixed or absorbed substance. For a sample P2 fabricated by conducting the nitric acid treatment with aqueous solution of nitric acid of 5 wt % for ten seconds, the peak indicating the fixed substance is considerably reduced. The shape of the peak is changed to almost a shape of a shoulder. For a sample P3 fabricated by conducting the nitric acid treatment with aqueous solution of nitric acid of 30 wt %, the peak of the fixed substance is almost vanished and has a shaped of a shoulder. It is difficult to identify a peak position of the fixed substance.

The results indicate that the nitric acid treatment is quite effective to minimize the absorbed or fixed substance on the surface. It has been known that material such as water is fixed on or is absorbed in a surface of oxide dielectric substance including lead. It is expectable that the fixed or absorbed water can be suppressed by the nitric acid treatment.

Figure 3A:
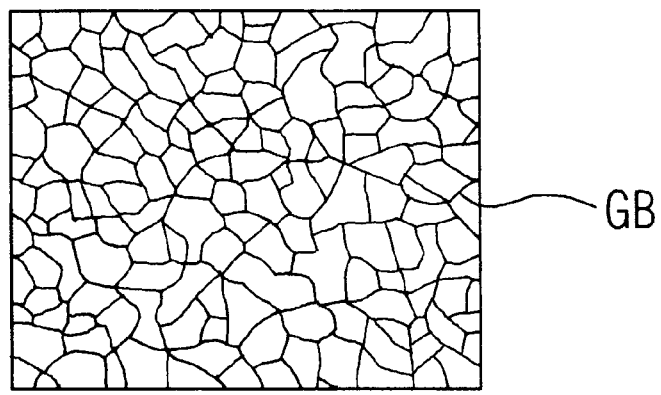
FIGS. 3A and 3B are sketches of electro-microscopic pictures of samples produced by the embodiment.
Figure 3B:
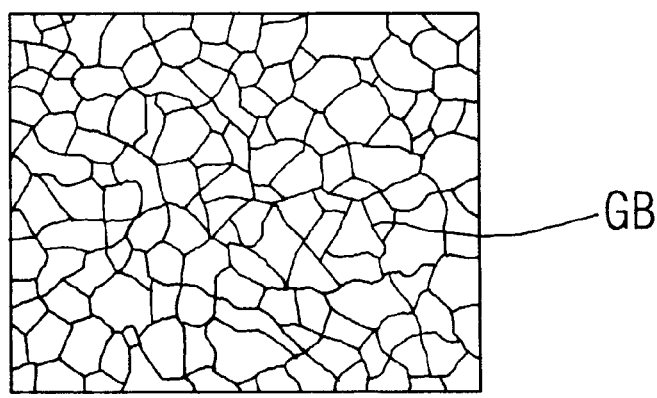

FIGS. 3A and 3B are sketches of pictures of an electron microscope of dielectric film surfaces after the nitric acid treatment. FIG. 3A shows the surface treated with aqueous solution of nitric acid of 5 wt % and FIG. 3B shows the surface treated with aqueous solution of nitric acid of 30 wt %. On both surfaces, the grains defined by grain boundaries GB have respectively almost uniform grain diameters and fixed or absorbed substances are not observed.

Figure 4B:
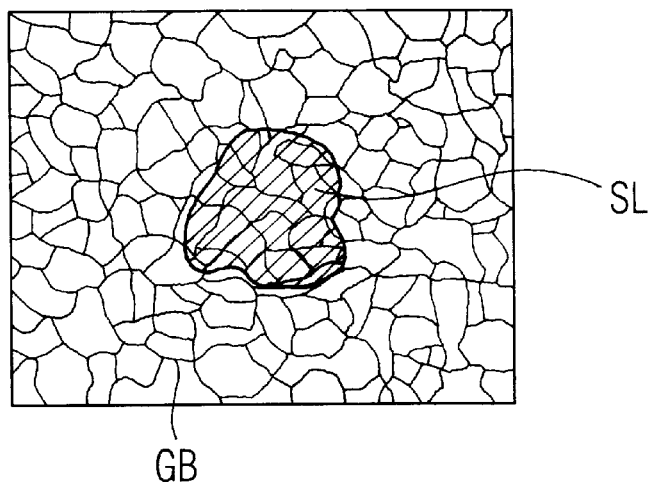

FIG. 4B is a sketch of a picture of an electron microscope of dielectric film surfaces prepared without conducting the nitric acid treatment. Although the dielectric film is crystallized, there is clearly observed fixed substance, called surface layer (SL) on the film.

After the crystallization of the dielectric film, an upper electrode is formed on the dielectric film. For this purpose, a platinum layer 20 with a thickness of about 100 nm is formed by sputtering.

The upper electrode of the sample for measurement has a size of about 50 micrometers (m$\mu$)×50 m$\mu$. After the upper electrode is formed, to recover damage of the dielectric film, the substrate is thermally treated at 650° C. for about one hour in an oxygen atmosphere. Electric characteristics of each sample are then measured.

FIG. 2B shows residual polarization charge $Q_{sw}$ and leakage current $I_L$ of each sample.

FIG. 2C shows an I-V characteristic of each sample. The characteristic indicates the leakage current which flows through a capacitor when a voltage is applied thereto, the current not flowing in an inherent state. The abscissa represents an applied voltage in unit of volt and the ordinate represents the leakage current in unit of ampere (A) per square centimeters ($cm^2$). A curve q1 indicates an I-V characteristic of a sample prepared without conducting the nitric acid treatment. Curves q2 and q3 are I-V characteristics respectively of samples prepared by conducting the nitric acid treatment with aqueous solution of nitric acid of 5 wt % and 30 wt %, respectively.

As can be seen from FIG. 2C, the I-V characteristics of the samples q2 and q3 prepared by conducting the nitric acid treatment are considerably lowered when compared with the I-V characteristic of the sample q1 prepared without conducting the nitric acid treatment.

In FIG. 2B, a column of leakage current $I_L$ shows values of leakage current $I_L$ at points respectively of 5 V and −5 V (applied voltage).

A field of residual polarization value $Q_{sw}$ shows values obtained as follows. Two positive pulses are applied to the sample at an interval of one second. After one second, two negative pulses are applied to the sample at an interval of one second. The residual polarization value $Q_{sw}$ is measured thereafter. The pulse has a height of 5 V and a length of 5 microseconds ($\mu s$). In none of the samples, the residual polarization value shows a significant change.

As a result, it is confirmed that the nitric acid treatment prevents the surface layer and hence brings about a dielectric film in which the leakage current is minimized.

In the samples treated with aqueous solution of nitric acid of 30 wt %, decrease of the dielectric film is observed. To avoid this phenomenon, the concentration of nitric acid in the aqueous solution is desired to be equal to or less than 30 wt %. In the samples treated with aqueous solution of nitric acid of 5 wt %, sufficient effect is observed. Although similar good effect is expectable using more concentrated aqueous solution of nitric acid, it will be desirable to employ aqueous solution of nitric acid of 2 wt % or less. Consequently, it is desirable to conduct the nitric acid treatment with aqueous solution of nitric acid from about 2 wt % to about 30 wt %.

Figure 5:
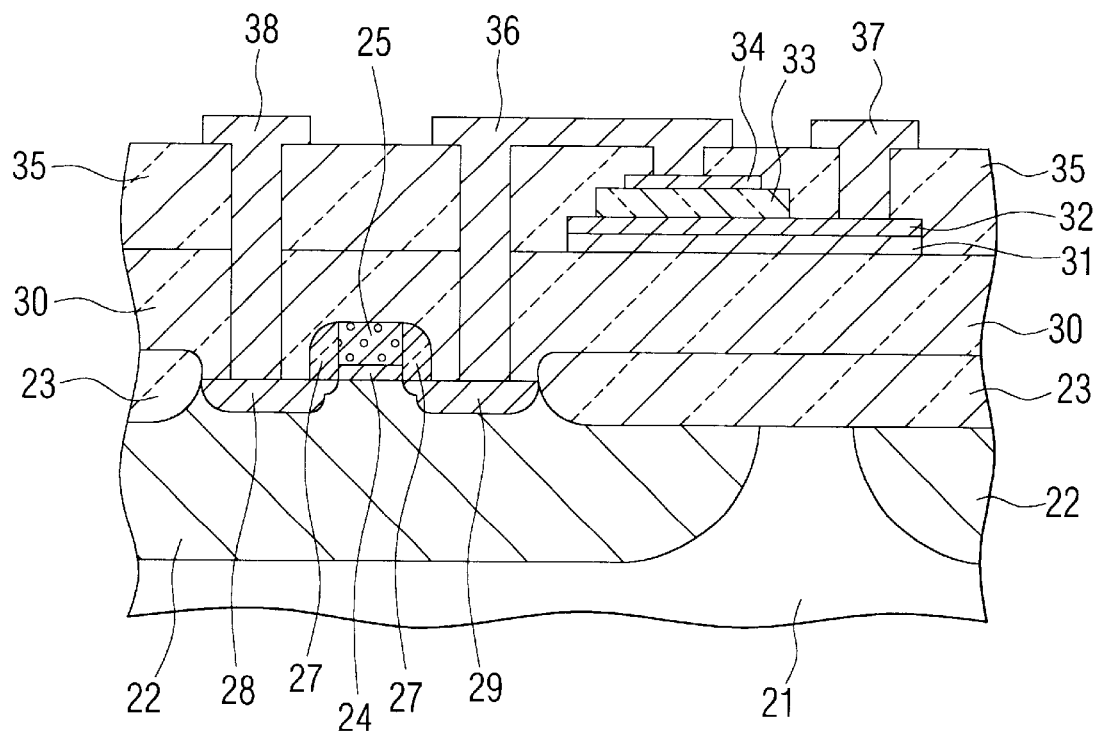
FIG. 5 is a cross-sectional view schematically showing constitution of an embodiment of a semiconductor device according to the present invention.

FIG. 5 shows a semiconductor substrate during a production process of a semiconductor device in a cross-sectional view. On a silicon substrate 21, a p-type well 22 is formed. The p-type well 22 may be a double well formed in an n-type well or a single well formed in an n-type substrate. On a surface of the silicon substrate 21, a field isolation film 23 is formed by local oxidization of silicon (LOCOS). In place of LOCOS, shallow trench isolation (STI) may be used.

In an active region surrounded by the field isolation film 23, a metal oxide semiconductor (MOS) transistor is formed. Over a surface of the p-type well 22, a gate electrode 25 is formed using a polycrystalline silicon layer (or a lamination of a polycrystalline silicon layer and a silicide layer) with a gate oxide film 24 therebetween. On both sides of the gate electrode 25, a silicide spacer 27 is formed using an oxide film or the like.

On both sides of the gate electrodes, source/drain regions 28 and 29 are formed in a lightly doped drain (LDD) structure through two ion implantation processes to resultantly form a transistor. A first inter-layer insulation film 30 is formed to surround the transistor, using a silicon oxide film by CVD or the like or using an oxide silicon film doped with phosphor (P) or boron (B). These constituent elements can be produced according to known techniques of the prior art.

On the first inter-layer insulation film 30, an adhesion layer 31 is formed with, for example, titanium (Ti) on which a main lower electrode 32 is formed using platinum (Pt) or the like. The main lower electrode 32 and the adhesion layer 31 can be patterned by ion milling with argon (Ar) gas or the like. A dielectric film 33 including lead is formed partially on the main lower electrode 32. The dielectric film 33 is, for example, a lead zirconate titanate (PZT) film formed according to the embodiment. On the dielectric film 33, an upper electrode 34 is formed. The upper electrode 34 is made of a platinum group metal, e.g., platinum resistive against high-temperature process.

Resultantly, a capacitor structure including the dielectric film 33 sandwiched between the lower and upper electrodes is constructed. A second inter-layer insulation layer 35 is formed to surround the capacitor structure, using silicon oxide or the like. Contact holes (via holes) are formed beginning at a surface of the second inter-layer insulation film 35 and reaching respectively the upper electrode 34, the lower electrode 32, and the source/drain regions 28 and 29. Wiring zones 36, 37, and 38 are formed in the contact (via) holes.

The wiring 36, 37, and 38 can be formed using, for example, aluminum (Al) or titanium nitride (TiN). In place of the single wiring, there may be formed plugs in the contact (via) holes and wiring layer patterns on upper surfaces of the plugs. Although the upper electrode of the capacitor is connected to the source/drain electrodes in the configuration, the lower electrode of the capacitor may be connected thereto. The modification can be achieved by changing the pattern of the wiring 36 and 37.

A semiconductor memory device has been constructed. When a ferrordielectric film of, for example, lead zirconate titanate (PZT) is used as the dielectric film 33, a ferroelectric RAM (FeRAM) is produced. When a high dielectric film is used as the dielectric film 33, a high-performance DRAM is produced.

Description has been given of the present invention according to embodiments. However, the present invention is not restricted by the embodiments. In the description, a lead zirconate titanate (PZT) film is mainly used as the dielectric film. However, even when another material such as lead titanate (PTO) is used as the dielectric substance including lead, a similar advantage can be expected through almost the same process. Various $ABO_3$ type perovskite materials may be employed.

In a layer of oxide including bismuth, for example, $Sr_1Bi_2Ta_2O_9$, bismuth serves, like lead, as a kernel of crystallization and has a characteristic to easily leave the film. According to the characteristics shared between lead and bismuth, it is expectable that the process including the nitric acid treatment is efficient also for an oxide dielectric layer including bismuth.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

I claim:

1. A method of forming a dielectric film, comprising the steps of:
   (a) forming on a surface of underlie substance a film of an oxide dielectric material including lead or bismuth;
   (b) dipping at least a whole top surface of the oxide dielectric film in solution including nitric acid to treat the surface and remove excess lead or bismuth; and
   (c) crystallizing the oxide dielectric film, after the surface treatment, by annealing the film and thereby obtaining an oxide dielectric film.

2. A method of forming a dielectric film according to claim 1, wherein said step (a) includes forming a film in an amorphous state.

3. A method of forming a dielectric film according to claim 1, wherein said step (a) includes sputtering, sol-gel process, or chemical vapor deposition (CVD).

4. A method of forming a dielectric film according to claim 1, wherein said oxide dielectric material is $ABO_3$ perovskite type dielectric material including lead.

5. A method of forming a dielectric film according to claim 4, wherein said film of oxide dielectric material excessively includes lead when compared with stoichiometric composition of said oxide dielectric material.

6. A method of forming a dielectric film according to claim 5, wherein said step (b) uses aqueous solution of nitric acid of from about 2 wt % to 30 wt %.

7. A method of forming a dielectric film according to claim 6, wherein said oxide dielectric material is lead titanate or lead zirconate titanate.

8. A method of forming a dielectric film according to claim 1, wherein said underlie surface is formed by a first conductive layer.

9. A method of forming a dielectric film according to claim 8, further comprising the step of (d) forming a second conductive layer on said oxide dielectric film.

10. A method of forming a dielectric film according to claim 9, wherein at least said first or second conductive layer is made of a platinum group element or oxide of a platinum group element.

11. A method of forming a capacitor, comprising the steps of:
    (a) forming on a surface of a first conductive layer a film of an oxide dielectric material including lead or bismuth;
    (b) dipping at least a whole top surface surface of the oxide dielectric film in solution including nitric acid to treat the surface and remove excess lead or bismuth;
    (c) crystallizing the oxide dielectric film, and after the surface treatment, by annealing the film and thereby obtaining an oxide dielectric film; and
    (d) forming a second conductive layer on said oxide dielectric film.

12. A method of forming a dielectric film according to claim 11, wherein said step (a) includes forming a film in an amorphous state.

13. A method of forming a dielectric film according to claim 11, wherein:
    said oxide dielectric material is $ABO_3$ perovskite type dielectric material including lead; and
    said film of oxide dielectric material excessively includes lead when compared with stoichiometric composition of said oxide dielectric material.

14. A method of forming a dielectric film according to claim 13, wherein said step (b) uses aqueous solution of nitric acid of from about 2 wt % to 30 wt %.

15. A method of forming a dielectric film according to claim 11, wherein at least said first or second conductive layer is made of a platinum group element or oxide of a platinum group element.

16. A method of forming a semiconductor device, comprising the steps of:
    (x) forming on a semiconductor substrate a transistor including one pair of current electrodes and a control electrode;

(y) covering the transistor with an inter-layer insulation film;

(z) forming a lower electrode on said inter-layer insulation film;

(a) forming on a surface of said lower electrode a film of an oxide dielectric material including lead or bismuth;

(b) dipping at least a whole top surface of the oxide dielectric film in solution including nitric acid to treat the surface and remove excess lead or bismuth;

(c) crystallizing the oxide dielectric film, after the surface treatment, by annealing the film and thereby obtaining an oxide dielectric film; and (d) forming a second conductive layer on said oxide dielectric film.

17. A method of forming a semiconductor device according to claim 16, further comprising the steps of (e) electrically connecting said upper electrode or said lower electrode to either one of said current electrodes.

18. A method of forming a semiconductor device according to claim 16 or 17, wherein said step (a) includes forming a film in an amorphous state.

19. A method of forming a semiconductor device according to claim 16, wherein:

said oxide dielectric material is $ABO_3$ perovskite type dielectric material including lead; and said film of oxide dielectric material excessively includes lead when compared with stoichiometric composition of said oxide dielectric material.

20. A method of forming a semiconductor device according to claim 19, wherein said step (b) uses aqueous solution of nitric acid of from about 2 wt % to 30 wt %.

* * * * *

UNITED STATES PATENT AND TRADEMARK OFFICE
CERTIFICATE OF CORRECTION

PATENT NO.    : 6,365,420 B2
DATED         : April 2, 2002
INVENTOR(S)   : Hiroshi Ashida It is certified that error appears in the above-identified patent and that said Letters Patent is hereby corrected as shown below:

<u>Title page,</u>
Item [30], Foreign Application Priority Data
"Feb. 16, 2000" should be -- May 16, 2000 --

Signed and Sealed this

Twenty-third Day of July, 2002

*Attest:*

*Attesting Officer*

JAMES E. ROGAN
*Director of the United States Patent and Trademark Office*